(12) United States Patent
Segawa et al.

(10) Patent No.: US 6,524,904 B1
(45) Date of Patent: Feb. 25, 2003

(54) METHOD OF FABRICATING SEMICONDUCTOR DEVICE

(75) Inventors: Mizuki Segawa, Osaka (JP); Masatoshi Arai, Nara (JP); Toshiki Yabu, Toyama (JP); Shunsuke Kugo, Toyama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/551,542

(22) Filed: Apr. 18, 2000

(30) Foreign Application Priority Data

Apr. 20, 1999 (JP) .......................................... 11-112510

(51) Int. Cl.⁷ ......................................... H01L 21/8238
(52) U.S. Cl. ........................ 438/232; 438/199; 438/514
(58) Field of Search ................................. 438/684, 199, 438/232, 249, 514, 522, 564

(56) References Cited

U.S. PATENT DOCUMENTS

| | | | |
|---|---|---|---|
| 5,021,356 A | * 6/1991 | Henderson et al. | 438/294 |
| 5,071,778 A | * 12/1991 | Solheim | 438/370 |
| 5,780,330 A | * 7/1998 | Choi et al. | 438/232 |
| 5,851,889 A | * 12/1998 | Michael et al. | 438/301 |
| 5,976,925 A | * 11/1999 | Cheek et al. | 438/231 |
| 6,051,459 A | * 4/2000 | Gardner et al. | 438/231 |
| 6,087,246 A | * 7/2000 | Lee | 438/517 |

FOREIGN PATENT DOCUMENTS

| | | |
|---|---|---|
| JP | 62-025451 | 2/1987 |
| JP | 05-074804 | 3/1993 |
| JP | 05-226593 | 9/1993 |
| JP | 06-077474 | 3/1994 |
| JP | 06-310666 | 11/1994 |
| JP | 07-161976 | 6/1995 |
| JP | 07-321234 | 12/1995 |

OTHER PUBLICATIONS

Wolf, S., Tauber R.N.; Silicon Processing for the VLSI Era vol. 1: Process Technology, Lattice Press, Sunset Beach, CA, 1986, p.p. 57–58.*
Japanese Office Action (with English translation), "Notice of Reasons of Rejection", Mailing Date: Jan. 8, 2002.
Notice of Reasons of Rejection from Japanese Patent Office, Patent Application No. 2000–108915 Mailing Date: May 14, 2002.

* cited by examiner

*Primary Examiner*—John F. Niebling
*Assistant Examiner*—Christopher Lattin
(74) *Attorney, Agent, or Firm*—Nixon Peabody LLP; Donald R. Studebaker

(57) ABSTRACT

After $P^+$ ions are implanted into a polysilicon film in an nMOSFET region, a heat treatment is performed to diffuse phosphorus down to the lower part of the polysilicon film. The diffusion reduces the concentration of phosphorus in an upper end portion of the polysilicon film and inhibits the upper end edges of a gate electrode from being increased in size during patterning. Then, $B^+$ ions are implanted into the polysilicon film in a pMOSFET region and the polysilicon film is etched into a gate configuration. Since a heat treatment for simultaneously diffusing phosphorus and boron in the polysilicon film is not performed, the entrance of boron from the gate electrode into a semiconductor substrate is inhibited, while the occurrence of side etching during the formation of an n-type polysilicon gate is suppressed.

8 Claims, 6 Drawing Sheets

METHOD OF FABRICATING SEMICONDUCTOR DEVICE

BACKGROUND OF THE INVENTION

The present invention relates to a method of fabricating a semiconductor device having, as components, a polysilicon film implanted with an n-type impurity and a polysilicon film implanted with a p-type impurity, each of the polysilicon films being formed on a single semiconductor substrate.

In recent years, MOS-type integrated circuits have been used in a growing number of digital circuits. Among the MOS-type integrated circuits, a CMOS device in which a pMOS transistor and an nMOS transistor are integrated has been used frequently because of its extremely low power consumption. The CMOS device or the like has a structure in which a polysilicon film implanted with an n-type impurity and a polysilicon film implanted with a p-type impurity are provided as components on a single semiconductor substrate. For example, there has been known a dual-gate CMOS device in which the gate electrode of an n-channel MOS transistor is doped with an n-type impurity and the gate electrode of a p-channel MOS transistor is doped with a p-type impurity.

FIGS. 6(a) to (d) are cross-sectional views illustrating the process of fabricating a conventional dual-gate CMOS device.

In the step shown in FIG. 6(a), a gate oxide film 102 is formed by thermal oxidation on a semiconductor substrate 102 to extend over a pMOSFET region Rp and an nMOSFET region Rn.

Next, in the step shown in FIG. 6(b), a polysilicon film 103 is deposited by CVD on the gate oxide film 102.

Next, in the step shown in FIG. 6(c), phosphorous ions (P$^+$) are implanted into a portion of the polysilicon film 103 included in the nMOSFET region Rn by using a resist film, whereby an n-type implanted region 104a is formed in a near-surface region of the polysilicon film 103. Subsequently, boron ions (B$^+$) are implanted into a portion of the polysilicon film 103 included in the pMOSFET region Rp by using a resist film, whereby a p-type implanted region 104b is formed in a near-surface region of the polysilicon film 103.

Next, in the step shown in FIG. 6(d), the polysilicon film 103 and the gate oxide film 102 are patterned by etching to form an n-type gate electrode 105 of an n-channel MOS transistor and a p-type gate electrode 106 of a p-channel MOS transistor.

In the process of fabricating the conventional dual-gate CMOS device, however, the phenomenon was observed in the step shown in FIG. 6(d) in which side etching occurred at both ends of the n-type implanted region 104a overlying the n-type gate electrode 105. The following is the result of assuming the cause of such a phenomenon.

After the process of ion implantation in the step (c), annealing is not normally performed prior to the subsequent step (d). This is for preventing boron penetration into the substrate as a result of diffusion. As a consequence, phosphorus and boron are present at high concentrations in the n-type implanted region 104a and in the p-type implanted region 104b. If etching is performed under such conditions, it may be considered that the amount of etching in the n-type implanted region 104a (upper part) containing phosphorus at a high concentration becomes larger than the amount of etching in the other portion (lower part) of the n-type gate electrode 105. If the size of the lower part of the n-type gate electrode 105 along the gate length is adjusted to 100 nm to 150 nm, the size of the upper part of the n-type gate electrode 105 (n-type implanted region 104a) along the gate length becomes 70 nm to 130 nm. Since side etching is observed in the upper part of the n-type gate electrode 105, if the gate electrode 105 is covered with nitride sidewalls or the like thereafter, voids may be formed in the side surfaces of the gate electrode. In the case of adopting a polycide structure in which a silicide film is provided on the polysilicon film to compose the gate electrode, side etching observed in the upper part of the n-type gate electrode 105 may degrade the adhesion between the polysilicon film and the silicide film. In the case of adopting a polymetal structure in which a metal film is provided on the polysilicon film to compose the gate electrode, side etching observed in the upper part of the n-type gate electrode 105 may degrade the adhesion between the polysilicon film and the metal film.

It is to be noted that side etching was not observed in the upper part of the p-type gate electrode 106. This may be because the manner in which silicon and boron are bonded is considered to be different from the manner in which silicon and phosphorus are bonded.

Such a phenomenon is not limited to the gate electrode and may also occur with a capacitor having an interconnect composed of a polysilicon film and an electrode composed of a polysilicon film.

SUMMARY OF THE INVENTION

It is therefore an object of the present invention to suppress, in a method of fabricating a semiconductor device having members composed of polysilicon films containing n-type and p-type impurities, such as a gate electrode and an interconnect, the occurrence of side etching in patterning the member composed of the polysilicon film containing an n-type impurity, while preventing a problem caused by boron diffusion.

The method of fabricating a semiconductor device comprises the steps of: (a) forming a polysilicon film on a semiconductor substrate; (b) implanting an n-type impurity into a portion of the polysilicon film; (c) performing a heat treatment for diffusing the n-type impurity with respect to the polysilicon film; (d) after the step (c), implanting a p-type impurity into another portion of the polysilicon film; and (e) after the step (d), patterning the polysilicon film by etching.

In accordance with the method, the n-type impurity has been diffused satisfactorily when the polysilicon film doped with the n-type impurity is patterned, so that the upper end portion of the polysilicon film is inhibited from being etched greatly in the lateral direction by the patterning. Consequently, the patterning of the polysilicon film does not cause side etching in the upper end portion of the formed member. This prevents an increase in the resistance of the member formed by patterning the polysilicon film. Since a heat treatment for simultaneously diffusing the n-type impurity and the p-type impurity has not been performed, the entrance of the p-type impurity from the polysilicon film into the semiconductor substrate that might be caused by the heat treatment is inhibited. In the case of using a MOS transistor, therefore, a semiconductor device with stable properties including threshold value can be fabricated.

The method further comprises the step of: prior to the step (a), forming a gate insulating film on the semiconductor substrate, wherein an n-type gate electrode and a p-type gate electrode are formed by the patterning in the step (e) such that the semiconductor device functioning as a dual gate transistor is formed. As a result, the upper and lower parts of the gate electrode are etched uniformly so that voids are not formed around the gate electrode even when nitride sidewalls, a cobalt silicide film, or the like is provided around the gate electrode. Since a heat treatment for simultaneously diffusing the n-type impurity and the p-type impurity has not been performed, the entrance of the p-type impurity from the gate electrode into the semiconductor substrate that might be caused by the heat treatment is inhibited. As a result, a transistor with stable properties including threshold value can be fabricated.

Preferably, a temperature range for the heat treatment in the step (c) is 750 to 850° C.

If the method further comprises the step of: forming a silicide film or a metal film on the polysilicon film, excellent adhesion can be maintained between the polysilicon film and silicide or between the polysilicon film and the metal film.

DESCRIPTION OF PREFERRED EMBODIMENTS

EMBODIMENT 1

A description will be given first to a structure of a dual gate transistor according to a first embodiment.

Figure 1:
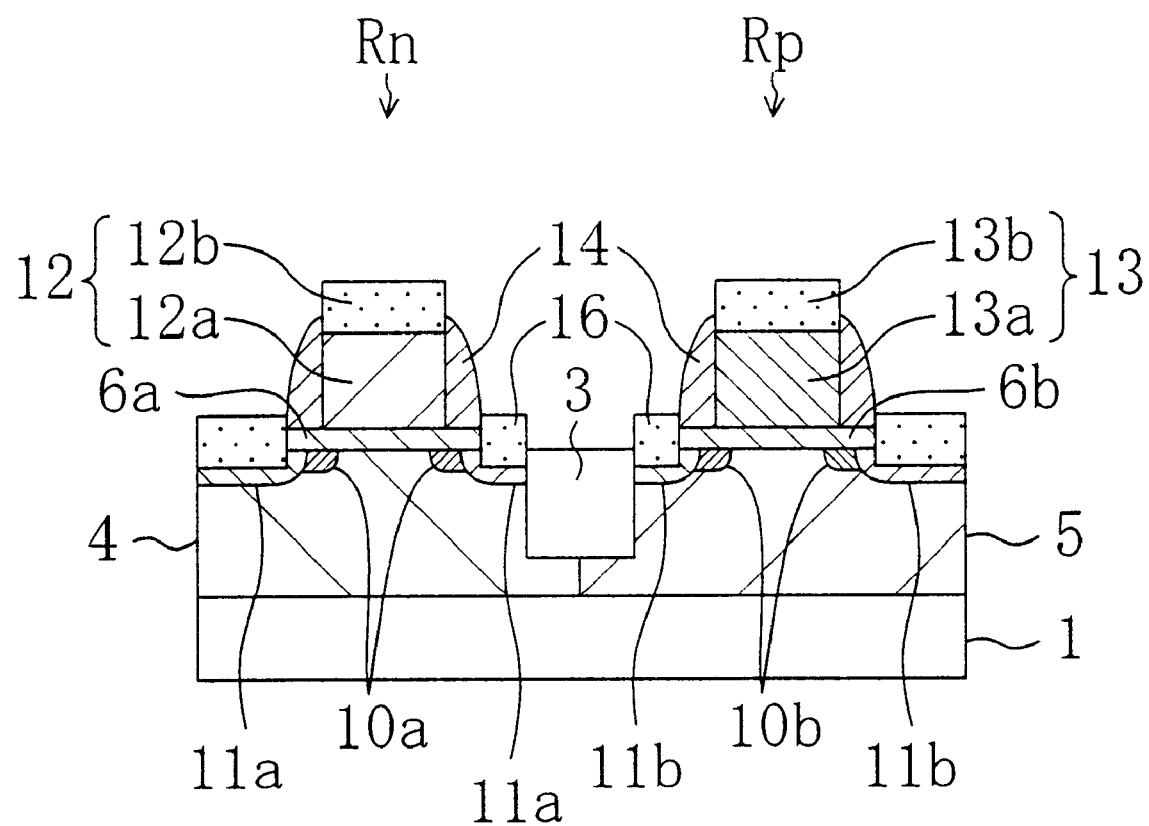
FIG. 1 is a cross-sectional view showing a structure of a dual gate transistor according to a first embodiment.

FIG. 1 is a cross-sectional view showing a structure of the dual gate transistor according to the first embodiment. As shown in FIG. 1, a pMOSFET region Rp and an nMOSFET region Rn are provided in a p-type silicon substrate 1 of the dual gate transistor. The pMOSFET region Rp and the nMOSFET region Rn are isolated by a trench insulating film 3 for isolation.

In the pMOSFET region Rp, a gate oxide film 6b and a p-type gate electrode 13 are provided upwardly in this order on an n-type well region 5 formed in the p-type silicon substrate 1. The p-type gate electrode 13 consists of a lower electrode 13a composed of a polysilicon film and an upper electrode 13b composed of a cobalt silicide film which are stacked in layers. Nitride sidewalls 14 are provided on part of the sidewalls of the upper electrode 13b and on the sidewalls of the lower electrode 13a. In the areas of the n-type well region 5 as an underlie which are located on both sides of the p-type gate electrode 13, there are provided p-type source/drain regions 11b containing an impurity at a high concentration and p-type LDD diffusion layers 10b. Cobalt silicide films 16 are formed on the p-type source/drain regions 11b.

In the nMOSFET region Rn, a gate oxide film 6a and an n-type gate electrode 12 are provided upwardly in this order on a p-type well region 4 formed in the p-type silicon substrate 1. The n-type gate electrode 12 consists of a lower electrode 12a composed of a polysilicon film and an upper electrode 12b composed of a cobalt silicide film which are stacked in layers. Nitride sidewalls 14 are provided on part of the sidewalls of the upper electrode 12b and on the sidewalls of the lower electrode 12a. In the areas of the p-type well region 4 as an underlie which are located on both sides of the n-type gate electrode 12, there are provided n-type source/drain regions 11a containing an impurity at a high concentration and n-type LDD diffusion layers 10a. The cobalt silicide films 16 are formed on the n-type source/drain regions 11a.

A description will be given next to the process of fabricating the dual gate transistor according to the first embodiment. FIGS. 2(a) to (e), FIGS. 3(a) to (d), and FIGS. 4(a) to (d) are cross-sectional views illustrating the process of fabricating the dual gate transistor according to the first embodiment.

Figure 2A:
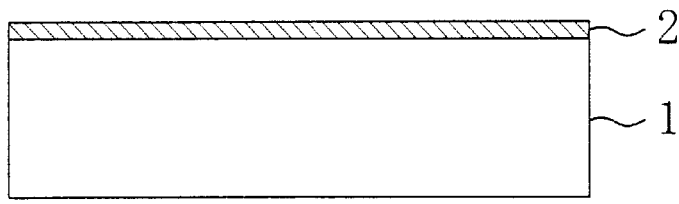
FIGS. 2(a) to (e) are cross-sectional views illustrating the process of fabricating the dual gate transistor according to the first embodiment.

First, in the step shown in FIG. 2(a), a protective oxide film 2 is formed by thermal oxidation on the p-type silicon substrate 1 having a principal surface of (100) plane.

Figure 2B:
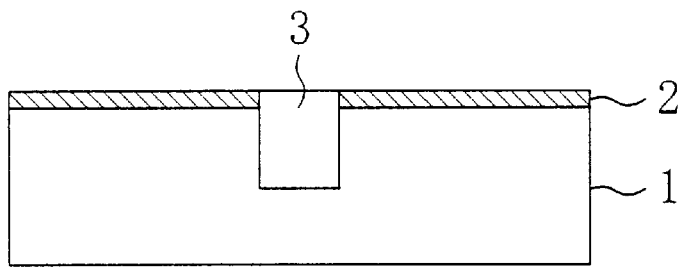

Then, in the step shown in FIG. 2(b), a protective nitride film is deposited by vacuum CVD on the protective oxide film 2. Thereafter, the nitride protective film and the protective oxide film 2 are patterned by dry etching using, as a mask, a resist film having an opening corresponding to a field region such that the field region is opened. Subsequently, a trench is formed by dry etching in a portion of the silicon substrate 1 corresponding to the field region. Then, a protective oxide film is formed by thermal oxidation on side surfaces of the trench. Thereafter, a silicon oxide film is deposited by CVD over the substrate including the trench, the deposition starting at the bottom portion of the trench. Next, the silicon oxide film is polished by CMP till a surface of the protective nitride film is exposed, whereby the silicon oxide film is buried in the trench to form the insulating film 3 for isolation. After that, the protective nitride film is removed thoroughly by using hot phosphoric acid.

Figure 2C:
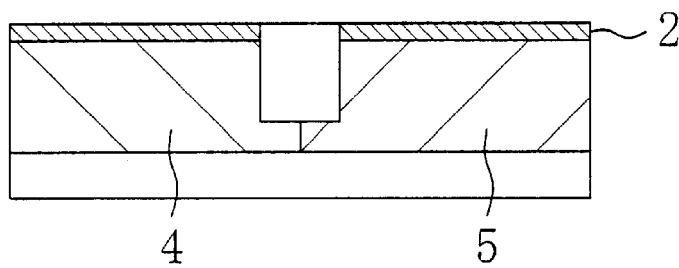

Next, in the step shown in FIG. 2(c), boron ions (B$^+$) are implanted at an implant energy of 20 keV and a dose of 2×10$^{12}$ cm$^{-2}$ into the p-type silicon substrate 1 in the nMOSFET region Rn by using a resist mask as an etching mask, whereby the p-type well region 4 is formed. Then, phosphorus ions (P$^+$) are implanted at an implant energy of 50 keV and a dose of 2×10$^{12}$ cm$^{-2}$ into the portion of the p-type silicon substrate 1 located in the pMOSFET region Rp by using the resist mask, whereby the n-type well region 5 is formed. Subsequently, a heat treatment for diffusing and activating the impurities in the p-type and n-type well regions 4 and 5 is performed.

Figure 2D:
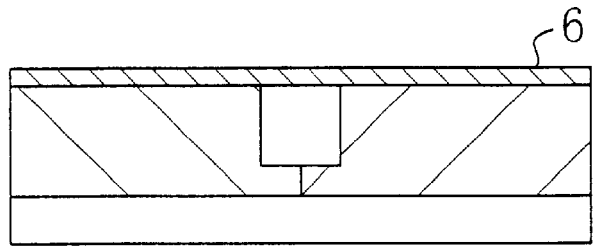

Next, in the step shown in FIG. 2(d), the protective oxide film 2 is removed by etching and then a gate oxide film 6 is formed by thermal oxidation.

Figure 2E:
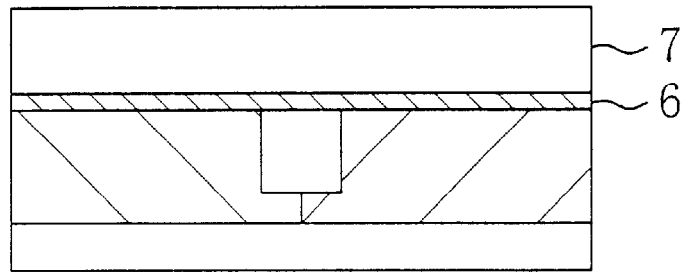

Next, in the step shown in FIG. 2(e), a polysilicon film 7 is formed by CVD on the gate oxide film 6.

Figure 3A:
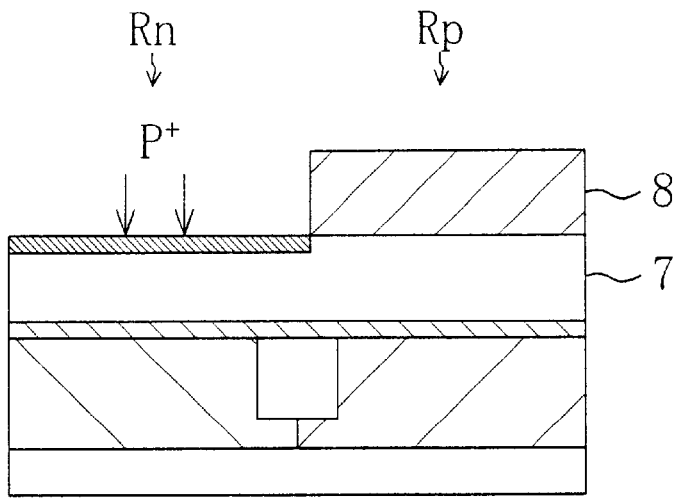
FIGS. 3(a) and (d) are cross-sectional views illustrating the process of fabricating the dual gate transistor according to the first embodiment.

Next, in the step shown in FIG. 3(a), a resist film 8 covering the pMOSFET region Rp and having an opening corresponding to the nMOSFET formation region Rn is formed on the polysilicon film 7. Thereafter, phosphorus ions (P$^+$) are implanted at an implant energy of 20 keV and a dose of 5×10$^{15}$ cm$^{-2}$ into a region of the polysilicon film located in the MOSFET region Rn by using the resist mask 8 as an implant mask.

Figure 3B:
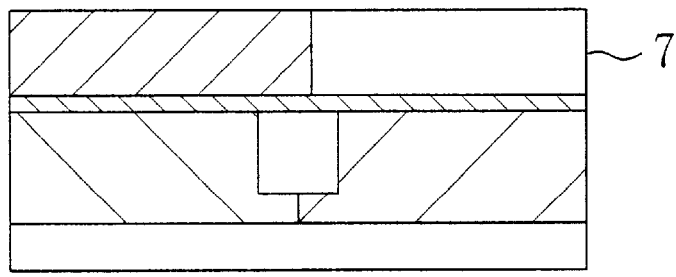

Next, in the step shown in FIG. 3(b), the resist film 8 is removed and then a heat treatment is performed at 800° C. for 30 minutes, thereby diffusing phosphorus implanted in the upper part of the polysilicon film 7 down to the lower part of the polysilicon film 7. Since the portion of the gate electrode which is etched unusually greatly during the formation of the gate electrode contains phosphorus at a particularly high concentration, the diffusing step renders the concentration of phosphorus in the gate electrode fairly uniform and thereby inhibits part of the gate electrode from being etched greatly.

The temperature of the heat treatment is preferably in the range of 750° C. to 850° C. If the temperature is 750° C. or lower, phosphorus implanted in the upper part of the polysilicon film 7 cannot satisfactorily be diffused down to the lower part of the polysilicon film 7, so that side etching might occur in the upper part of the n-type gate electrode 12 during the formation of the gate electrode. If the temperature is 850° C. or higher, on the other hand, phosphorus might be diffused into the p-type well region 4. To diffuse phosphorus uniformly in the polysilicon film 7, the heat treatment is performed preferably for 30 minutes or more if the temperature for the heat treatment is 750° C. or preferably for 20 minutes or more if the temperature for the heat treatment is 850° C.

It is to be noted that oxygen has been added to an ambient atmosphere in the step of the heat treatment. The added oxygen oxidizes the surface of the polysilicon film 7. Thus, the heat treatment causes phosphorus that has been implanted into the polysilicon film 7 to be diffused temporarily to the outside of the polysilicon film 7 and prevents it from entering the polysilicon film 7 (particularly the portion of the polysilicon film 7 located in the pMOSFET region Rp which will form the p-type gate electrode in the subsequent step). The heat treatment also prevents phosphorus that has been implanted in the polysilicon film 7 from being diffused into the portion which will form the p-type gate electrode in the subsequent step. This renders the properties of the transistor (including threshold value) stable.

Figure 3C:
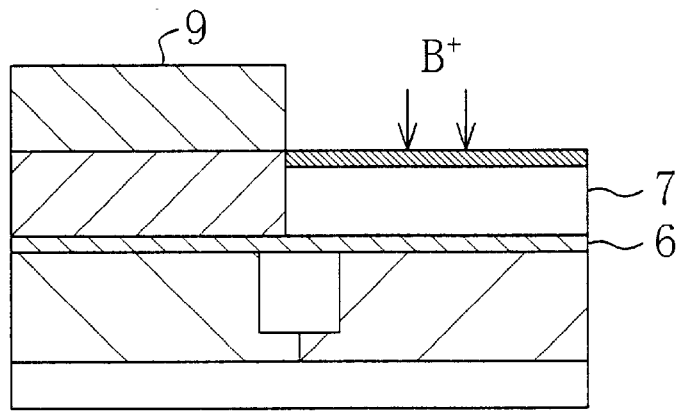

Next, in the step shown in FIG. 3(c), a resist film 9 covering the nMOSFET region Rn and having an opening corresponding to the pMOSFET formation region Rp is formed on the polysilicon film 7. Thereafter, boron ions ($B^+$) are implanted at an implant energy of 10 keV and a dose of $3 \times 10^{15}$ cm$^{-2}$ into the polysilicon film 7 in the pMOSFET region Rp by using the resist mask 9 as an implant mask.

It is to be noted that, even if the gate electrode 13 is formed by performing etching with boron atoms (B) localized in the upper part of the polysilicon film 7, there arises no such situation where part of the p-type gate electrode 13 is etched greatly. This may be because silicon atoms and impurity atoms are bonded in different manners in the polysilicon film 7 implanted with boron ions ($B^+$), i.e., in the p-type polysilicon region, and in the n-type polysilicon region. Accordingly, there is no need to perform a heat treatment with respect to the substrate after the implantation of the boron ions ($B^+$) and prior to the etching for forming the gate electrode.

Figure 3D:
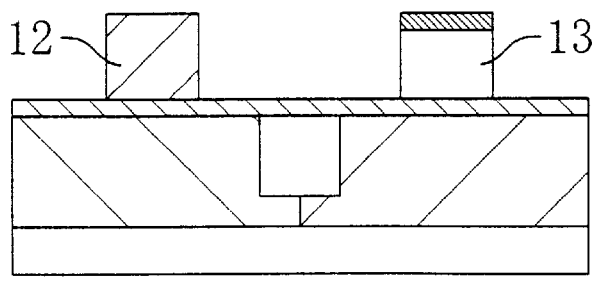

Next, in the step shown in FIG. 3(d), the resist film 9 is removed and then a resist film (not shown) covering the gate electrode formation regions is formed on the polysilicon film 7. Dry etching is performed with respect to the polysilicon film 7 by using the resist film as a mask, thereby forming the gate electrodes 12 and 13.

Figure 4A:
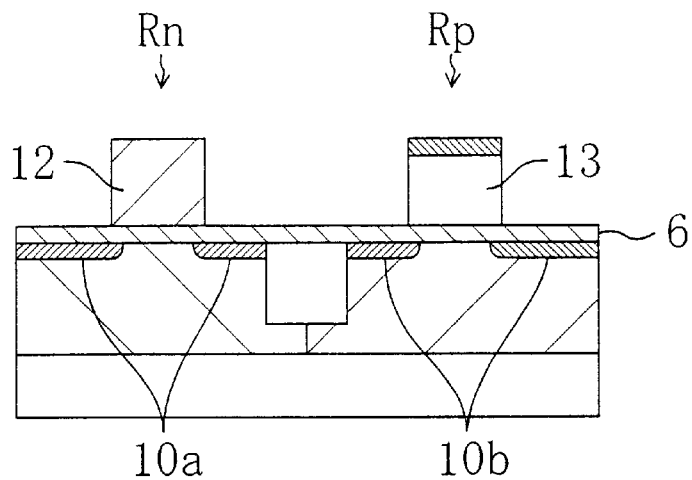
FIGS. 4(a) to (d) are cross-sectional views illustrating the process of fabricating the dual gate transistor according to the first embodiment.

Next, in the step shown in FIG. 4(a), arsenic ions ($As^+$) are implanted at an implant energy of 20 keV, a dose of $1 \times 10^{14}$ cm$^{-2}$, and a tilt angle of approximately 0° by using a resist film (not shown) covering the pMOSFET region Rp and having an opening corresponding to the nMOSFET region Rn and the n-type gate electrode 12 as a mask in order to form the n-type LDD diffusion layers 10a in the p-type well region 4. On the other hand, boron fluoride ions ($BF_2^+$) are implanted at an implant energy of 20 keV, a dose of $6 \times 10^{13}$ cm$^{-2}$, and a tilt angle of approximately 0° by using a resist film (not shown) covering the nMOSFET region Rn and having an opening corresponding to the pMOSFET region Rp and the p-type gate electrode 13 as a mask in order to form the LDD diffusion layers 10b in the n-type well region 5.

Figure 4B:
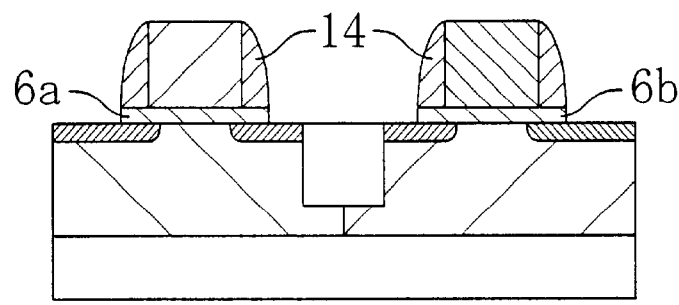

Next, in the step shown in FIG. 4(b), a nitride film for sidewalls is deposited by CVD over the entire surface of the substrate and then etched back to form the nitride sidewalls 14. At this time, boron that has been implanted into the upper part of the p-type gate electrode 13a is diffused into the entire p-type gate electrode 13a by heat generated during the deposition of the nitride film for sidewalls. The portions of the gate oxide film 6 uncovered with the gate electrode 12 and the nitride sidewalls 14 are removed by the etching process, whereby the gate oxide films 6a and 6b are formed.

Figure 4C:
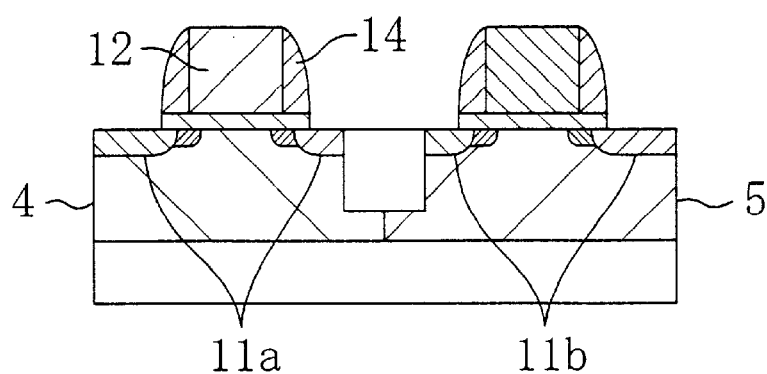

Next, in the step shown in FIG. 4(c), arsenic ions ($As^+$) are implanted at an implant energy of 50 keV, a dose of $2 \times 10^{15}$ cm$^{-2}$, and a tilt angle of 7° by using a resist film (not shown) covering the pMOSFET region Rp and having an opening corresponding to the nMOSFET region Rn, the n-type gate electrode 12, and the nitride sidewalls 14 as a mask in order to form the n-type source/drain regions 11a in the p-type well region 4. On the other hand, boron ions ($B^+$) are implanted at an implant energy of 10 keV, a dose of $2 \times 10^{15}$ cm$^{-2}$, and a tilt angle of 7° by using a resist film (not shown) covering the nMOSFET region Rn and having an opening corresponding to the pMOSFET region Rp, the p-type gate electrode 13, and the nitride sidewalls 14 as a mask in order to form the p-type source/drain regions 11b in the n-type well region 5. Thereafter, short-time annealing is performed at 100° C. for 10 seconds, thereby diffusing arsenic implanted in the p-type well region 4 and boron implanted in the n-type well region 5. As a result, the n-type source/drain regions 11a and the p-type source/drain regions 11b are formed. Since annealing time is extremely short, the process of short-time annealing can inhibit phosphorus in the n-type gate electrode 12 from being diffused into the p-type well region 4 and inhibit boron in the p-type gate electrode 13 from entering the n-type well region 5.

Figure 4D:
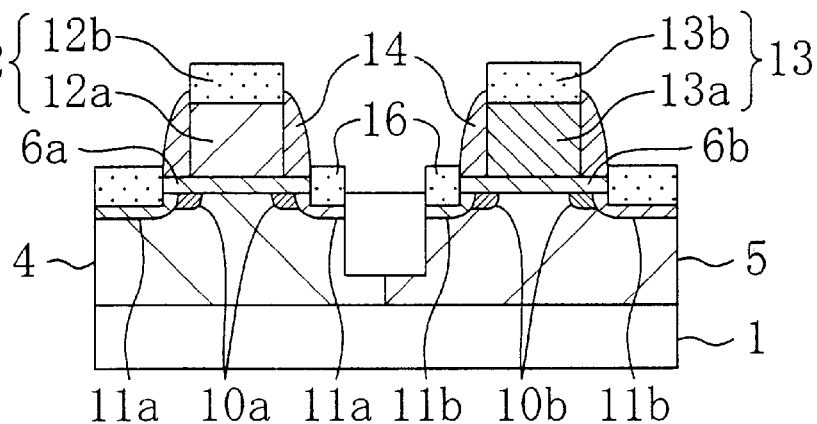

Next, in the step shown in FIG. 4(d), a cobalt film is deposited by sputtering over the entire surface of the substrate and a short-time heat treatment is performed to cause reactions among cobalt, polysilicon, and silicon, thereby siliciding cobalt. Thereafter, the unreacted portion of the cobalt film is etched away, whereby the cobalt silicide films 16 are formed on the n-type source/drain regions 11a and on the p-type source/drain regions 11b. The respective surface portions of the n-type gate electrode 12 and the p-type gate electrode 13 are also silicided to provide a structure in which the n-type gate electrode 12 consists of the lower electrode 12a composed of n-type polysilicon and the upper electrode 12b composed of silicide and a structure in which the p-type gate electrode 13 consists of the lower electrode 13a composed of p-type polysilicon and the upper electrode 13b composed of silicide. The dual gate transistor according to the first embodiment has thus been formed.

Although the first embodiment has used the polysilicon film 7 as a material composing the gate electrodes 12 and 13, an amorphous silicon film may also be used instead.

Although the first embodiment has fabricated the dual gate transistor, it will easily be appreciated that an interconnect, a capacitor, or the like having a structure including a polysilicon film implanted with an n-type impurity and a polysilicon film implanted with a p-type impurity, which are formed on a single substrate, can also be fabricated by the same process as shown in FIGS. 2(a) to (e) and FIGS. 3(a) to (d).

To suppress the occurrence of side etching in the n-type gate electrode 12, annealing may also be performed prior to the etching for forming the n-type gate electrode 12 and the p-type gate electrode 13. The annealing is for diffusing phosphorus present at a high concentration in the upper part of the polysilicon film 7 into the polysilicon film 7.

In the polysilicon film 7, however, boron is diffused by the annealing in a wider region than phosphorus. If phosphorus and boron are diffused simultaneously, boron implanted in the upper part of the polysilicon film 7 enters the p-type silicon substrate 1 as a result of diffusion. Boron with which the p-type silicon substrate 1 is doped may deviate the properties of the pMOSFET including threshold value from design values.

To prevent these, the fabrication method according to the first embodiment has implanted the phosphorus ions (P$^+$) in the polysilicon film 7 in the nMOSFET region Rn and then diffused phosphorus down to the lower part of the polysilicon film 7 by the heat treatment. Therefore, the first embodiment can inhibit the upper end edges of the n-type gate electrode 12 from being etched greatly in the lateral direction when the polysilicon film is patterned. This prevents phosphorus in the n-type gate electrode 12 from being lost and further prevents an increase in the resistance of the n-type gate electrode 12. Since the upper and lower parts of the gate electrodes 12 and 13 are etched nearly uniformly in the first embodiment, voids are not formed in the side surfaces of the gate electrode 12 and 13 even when the nitride sidewalls 14 or the like are provided on the side surfaces of the gate electrodes 12 and 13. The suppression of the formation of voids can prevent the lowering of mutual adhesion between the lower electrodes 12a and 13a and the upper electrodes 12b and 13b after silicidation.

When the polysilicon film 7 is patterned to form the gate electrodes, there is no such situation where part of the p-type gate electrode 13 is etched greatly. This may be because silicon atoms and impurity atoms are considered to be bonded in different manners in the p-type and n-type regions. Hence, there is no need to perform a heat treatment after the implantation of the boron ions (B$^+$) and prior to the etching for forming the gate electrodes. It follows therefore that the entrance of boron from the p-type gate electrode 13 into the n-type well region 5 that has been caused by the heat treatment in accordance with the conventional fabrication method is inhibited in the fabrication method according to the first embodiment. Thus, the first embodiment allows the fabrication of a transistor with stable properties including threshold value.

EMBODIMENT 2

The process of fabricating a dual gate transistor according to a second embodiment is the same as the steps illustrated in FIGS. 2(a) to (e), FIGS. 3(a) to (c), and FIGS. 4(a) to (d) of the process of fabricating the dual gate transistor according to the first embodiment. This means that, in the second embodiment also, phosphorus in the polysilicon film 7 in the nMOSFET region Rn has been diffused satisfactorily but boron in the polysilicon film 7 in the pMOSFET region Rp has not been diffused, similarly to the steps illustrated in FIGS. 2(a) to (e) and FIGS. 3(a) to (c) according to the first embodiment. In addition, source/drain regions and the like are also formed after the formation of gate electrodes in the second embodiment, similarly to the steps shown in FIGS. 4(a) to (d) according to the first embodiment. Therefore, a description will be given to a step subsequent to the step shown in FIG. 3(c) and previous to the step shown in FIG. 4(a), which renders the second embodiment different from the first embodiment.

Figure 5A:
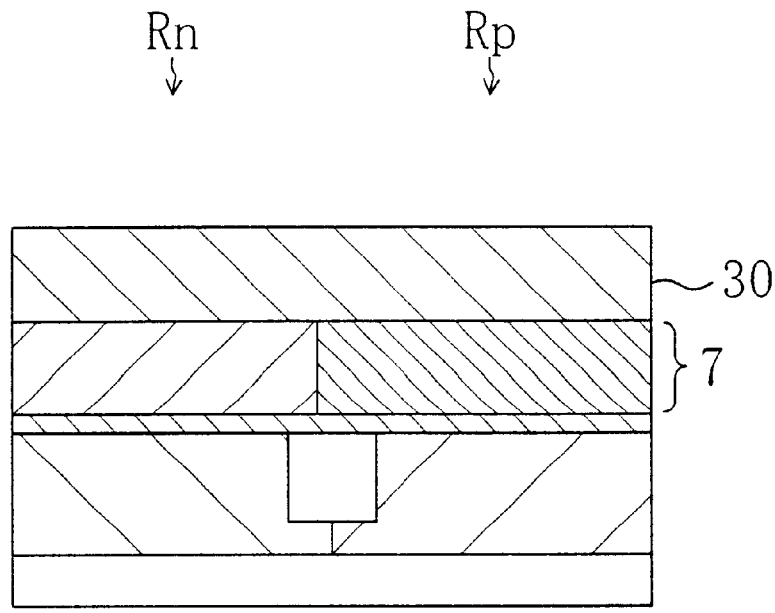
FIGS. 5(a) and (b) are cross-sectional views illustrating the process of fabricating a dual gate transistor according to a second embodiment.

FIGS. 5(a) and (b) are cross-sectional views illustrating the process of fabricating the dual gate transistor according to the second embodiment.

In the step shown in FIG. 5(a), the resist film is removed and then a tungsten film 30 is deposited by vapor deposition on the polysilicon film 7. Heat generated by the deposition diffuses boron that has been implanted in the upper part of the portion of the polysilicon film 7 located in the pMOSFET region Rp down to the lower part of the portion of the polysilicon film 7.

Figure 5B:
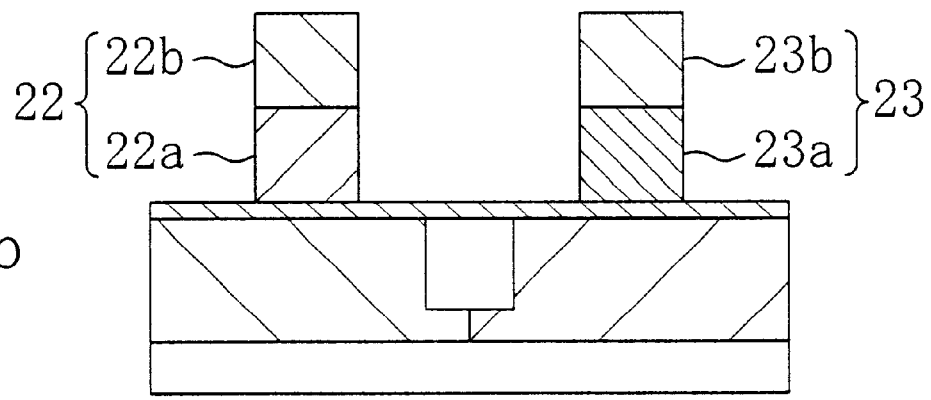
Figure 6A:
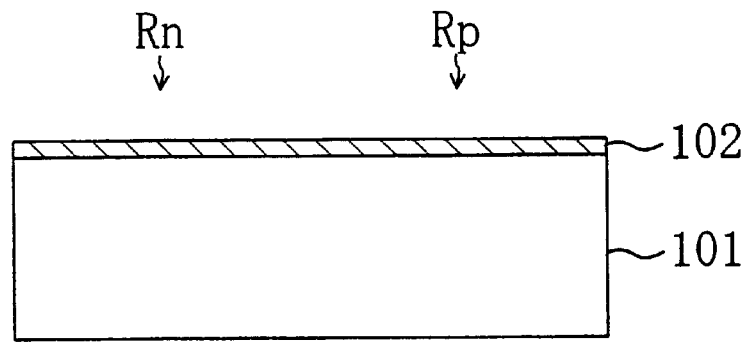
FIGS. 6(a) to (d) are cross-sectional views illustrating the process of fabricating a conventional dual-gate CMOS device.
Figure 6B:
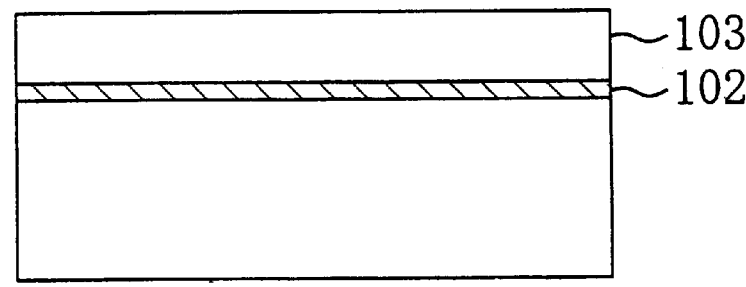
Figure 6C:
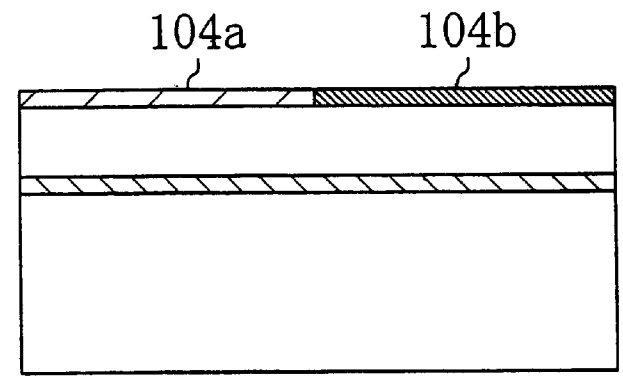
Figure 6D:
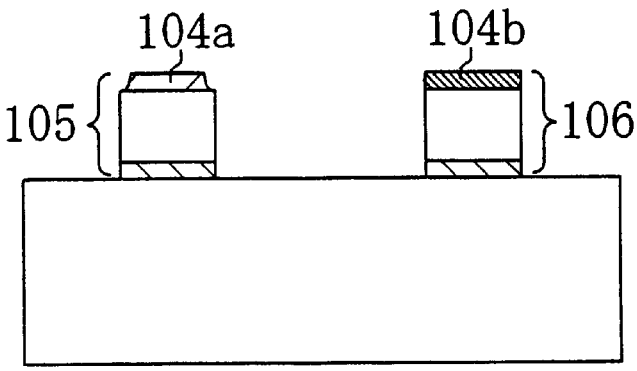

Next, in the step shown in FIG. 5(b), a resist film (not shown) covering the gate electrode formation regions is formed on the polysilicon film 7. Then, etching is performed by using the resist film as an etching mask, thereby forming an n-type gate electrode 22 having a polymetal gate structure consisting of a lower electrode 22a composed of the polysilicon film and an upper electrode 22b composed of the tungsten film and a p-type gate electrode 23 having a polymetal gate structure consisting of a lower electrode 23a composed of the polysilicon film and an upper electrode 23b composed of the tungsten film.

In the step shown in FIG. 5(a), a silicide film may also be deposited by CVD on the polysilicon film 7 after the removal of the resist film.

In the second embodiment also, phosphorus ions (P$^+$) are implanted into the polysilicon film 7 in the nMOSFET region Rn and then diffused down to the lower part of the polysilicon film 7 by the heat treatments, similarly to the first embodiment. As a result, the upper end edges of the n-type gate electrode are inhibited from being etched greatly in the lateral direction during the formation of the gate electrode. This prevents phosphorus in the lower electrode from being lost and further prevents an increase in the resistance of the n-type gate electrode. Since the upper and lower parts of the lower electrode are etched uniformly, voids are not formed around the gate electrode even when nitride sidewalls or the like are provided around the lower electrode. The suppression of the formation of voids further prevents the lowering of adhesion between the upper and lower electrodes.

In addition, the entrance of boron from the p-type gate electrode into the n-type well region that has been caused by the heat treatment in accordance with the conventional fabrication method is also inhibited by separately performing the diffusion of phosphorus and the diffusion of boron in the polysilicon film 7 in the fabrication method according to the second embodiment. Thus, the second embodiment allows the fabrication of a transistor with stable properties including threshold value.

What is claimed is:

1. A method of fabricating a semiconductor device, the method comprising the steps of:

(a) forming a polysilicon film on a semiconductor substrate;

(b) implanting an n-type impurity into a portion of the polysilicon film;

(c) performing a heat treatment for diffusing the n-type impurity with respect to the polysilicon film;

(d) after step (c), implanting a p-type impurity into another portion of the polysilicon film;

(e) after step (d), forming a metal film on top of the polysilicon film; and (f) after step (e), patterning the metal film and polysilicon film by etching.

2. The method of claim 1, further comprising the step of:

prior to step (a), forming a gate insulating film on the semiconductor substrate, wherein according to the patterning process (f), a polymetal gate structured n-type gate electrode and p-type gate electrode, wherein each possesses both a lower electrode of the polysilicon film and an upper electrode of the metal film, are formed.

3. The method of claim 1, further comprising the step of:

in step (e), due to the heat produced during the forming of the metal film, diffusion of the p-type impurity to the lower portion of the polysilicon film.

4. The method of claim 1, wherein a temperature range for the heat treatment in step (c) is 750 to 850° C.

5. A method of fabricating a semiconductor device, the method comprising the steps of:

(a) forming a polysilicon film on a semiconductor substrate;

(b) implanting an n-type impurity into a portion of the polysilicon film;

(c) performing a heat treatment in oxygenated atmosphere for diffusing the n-type impurity with respect to the polysilicon film;

(d) after the step (c), implanting a p-type impurity into another portion of the polysilicon film;

(e) after the step (d), patterning the polysilicon film by etching; and (f) after the step (e), according to the CVD method, depositing a sidewall film onto the top of the entire surface of the semiconductor substrate, wherein, due to the heat produced during the depositing process of the sidewall film; the p-type impurities implanted into the top portion of the said p-type gate electrode, diffuses over the entire p-type gate electrode.

6. The method of claim 5, further comprising the step of:

prior to the step (a), forming a gate insulating film on the semiconductor substrate, wherein an n-type gate electrode and a p-type gate electrode are formed by the patterning in the step (e) such that the semiconductor device functioning as a dual gate transistor is formed.

7. The method of claim 5, wherein a temperature range for the heat treatment in the step (c) is 750 to 850° C.

8. The method of claim 5, further comprising the step of:

forming a silicide film on the polysilicon film.

* * * * *